(12) United States Patent
Tamada

(10) Patent No.: US 8,576,627 B2
(45) Date of Patent: *Nov. 5, 2013

(54) MEMORY ARRAY WITH INVERTED DATA-LINES PAIRS

(75) Inventor: Satoru Tamada, Kamakura (JP)

(73) Assignee: Micron Technology, Inc., Boise, ID (US)

( * ) Notice: Subject to any disclaimer, the term of this patent is extended or adjusted under 35 U.S.C. 154(b) by 216 days.

This patent is subject to a terminal disclaimer.

(21) Appl. No.: 13/178,278

(22) Filed: Jul. 7, 2011

(65) Prior Publication Data

US 2011/0267882 A1    Nov. 3, 2011

Related U.S. Application Data

(63) Continuation of application No. 12/367,097, filed on Feb. 6, 2009, now Pat. No. 7,983,085.

(51) Int. Cl.
*G11C 16/04*    (2006.01)

(52) U.S. Cl.
USPC ............ 365/185.13; 365/185.06; 365/185.07; 365/185.12

(58) Field of Classification Search
USPC .............. 365/185.13, 185.06, 185.07, 185.12
See application file for complete search history.

(56) References Cited

U.S. PATENT DOCUMENTS

| 5,734,609 | A | * | 3/1998 | Choi et al. | 365/185.17 |
| 5,923,587 | A | * | 7/1999 | Choi | 365/185.11 |
| 6,154,400 | A | * | 11/2000 | Wang et al. | 365/202 |
| 6,650,567 | B1 | | 11/2003 | Cho et al. | |
| 7,710,774 | B2 | | 5/2010 | Chen et al. | |
| 7,983,085 | B2 | * | 7/2011 | Tamada | 365/185.13 |
| 8,223,561 | B2 | * | 7/2012 | Bicksler | 365/185.28 |

* cited by examiner

*Primary Examiner* — Pho M Luu
(74) *Attorney, Agent, or Firm* — Leffert Jay & Polglaze, P.A.

(57) ABSTRACT

At least one data-line pair has a first data line aligned with a first column of memory cells and a second data line aligned with a second column of memory cells. The first data line is coupled to the second column of memory cells and the second data line is coupled to the first column of memory cells.

20 Claims, 12 Drawing Sheets

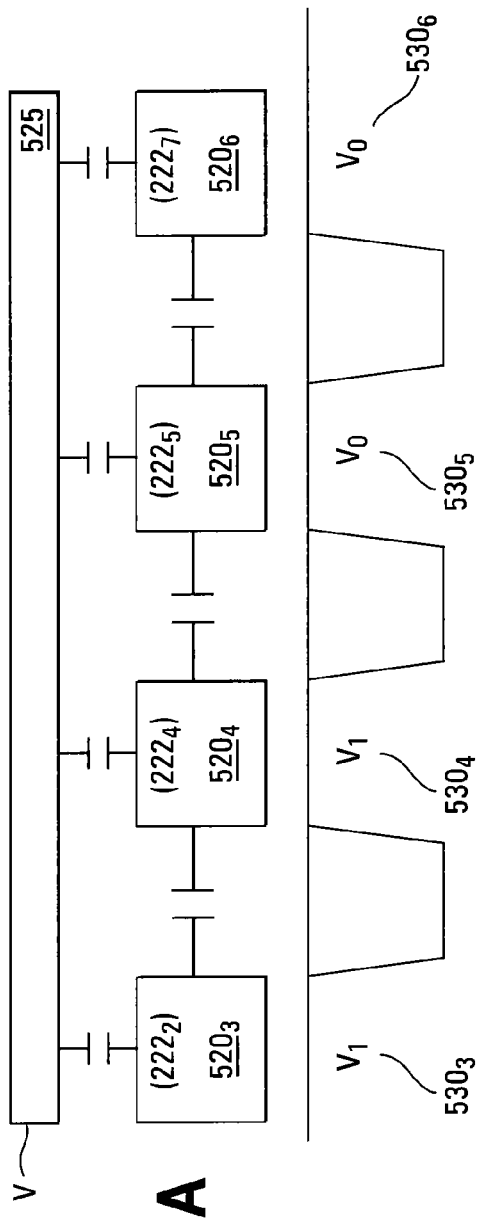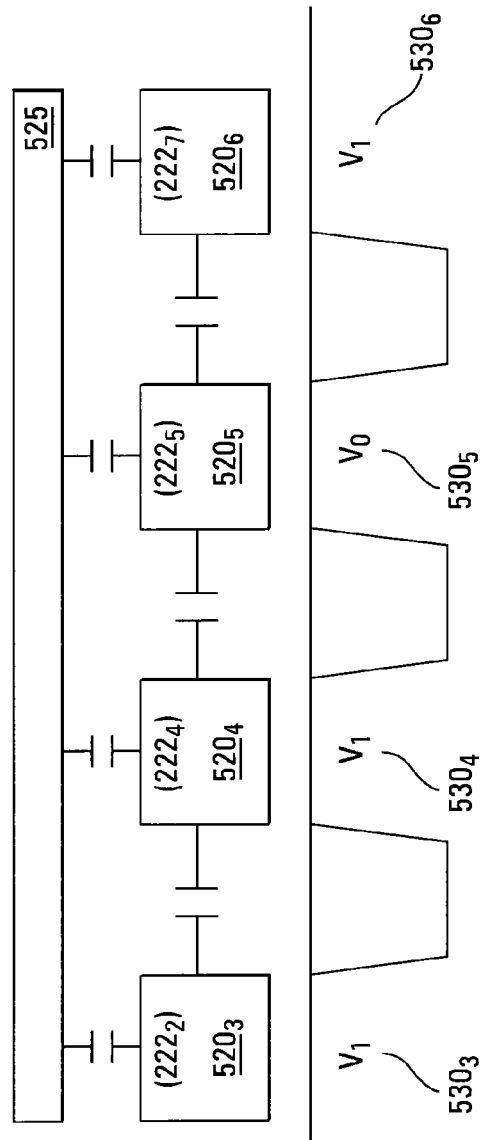
FIG. 5A
FIG. 5B

MEMORY ARRAY WITH INVERTED DATA-LINES PAIRS

RELATED APPLICATION

This application is a continuation of U.S. application Ser. No. 12/367,097, titled "MEMORY ARRAY WITH INVERTED DATA-LINE PAIRS," filed Feb. 6, 2009 and issued as U.S. Pat. No. 7,983,085 on Jul. 19, 2011, which application is commonly assigned and incorporated entirely herein by reference.

FIELD

The present disclosure relates generally to memory arrays and in particular the present disclosure relates to memory arrays with inverted data-line pairs.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming (which is sometimes referred to as writing) of charge storage nodes (e.g., floating gates or trapping layers) or other physical phenomena (e.g., phase change or polarization), determine the data value of each cell. Common uses for flash memory include personal computers, personal digital assistants (PDAs), digital cameras, digital media players, cellular telephones, and removable memory modules.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select lines, a source select line and a drain select line. A "column" refers to a group of memory cells that are commonly coupled to a local data line, such as a local bit line. It does not require any particular orientation or linear relationship, but instead refers to the logical relationship between memory cell and data line. The source select line includes a source select gate at each intersection between a NAND string and the source select line, and the drain select line includes a drain select gate at each intersection between a NAND string and the drain select line. The select gates are typically field-effect transistors. Each source select gate is connected to a source line, while each drain select gate is connected to a data line, such as column bit line.

The memory array is accessed by a row decoder activating a row of memory cells by selecting the word line connected to (and, in some cases, formed by) a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the column bit line to the source line through each NAND string via the corresponding select gates, restricted only by the selected memory cells of each string. This places the current-encoded data values of the row of selected memory cells on the column bit lines.

For some applications, flash memory stores a single bit per cell. Each cell is characterized by a specific threshold voltage, which is sometimes referred to as the Vt level. Within each cell, two or more possible Vt levels exist. These Vt levels are controlled by the amount of charge that is programmed or stored on the floating gate. For some NAND architectures, for example, a memory cell might have a Vt level greater than zero in a programmed (e.g., logic zero) state and a Vt level less than zero in an erase (e.g., logic one) state.

Memory cells are typically programmed using program/erase cycles, e.g., where the memory cells are first erased and subsequently programmed. For a NAND array, a block of memory cells is typically erased by grounding all of the word lines in the block and applying an erase voltage to a semiconductor substrate on which the memory cells are formed, and thus to the channels of the memory cells, to remove the charge from the floating gates. More specifically, the charge is removed through Fowler-Nordheim tunneling of electrons from the floating gate to the channel, resulting in an Vt level typically less than zero in an erased state.

Programming typically involves applying a program voltage to one or more selected word lines and thus to the control gate of each memory cell coupled to the one or more selected word lines, regardless of whether a memory cell is targeted or untargeted for programming. While the program voltage is applied to the one or more selected word lines, a potential, such as a ground potential, is applied to the substrate, and thus to the channels of these memory cells, to charge the floating gates. More specifically, the floating gates are typically charged through direct injection or Fowler-Nordheim tunneling of electrons from the channel to the floating gate, resulting in a Vt level typically greater than zero in a programmed state. In addition, a potential, such as a ground potential, is typically applied to the bit lines coupled to NAND strings containing memory cells targeted for programming and an inhibit voltage is typically applied to bit lines coupled NAND strings containing memory cells that are not targeted for programming.

Programming is sometimes accomplished by applying the program voltage to the one or more selected word lines and applying the ground potential to every other bit line at a time, such as the even-numbered bit lines coupled to even-numbered NAND strings followed by the odd-numbered bit lines coupled to odd-numbered NAND strings. This means that the targeted memory cells in the even-numbered NAND strings are programmed first followed by the targeted memory cells in the odd-numbered NAND strings.

The subsequent programming of the targeted memory cells in the odd-numbered NAND strings generally involves applying a program voltage to targeted memory cells in odd-numbered NAND strings on either side of the previously programmed memory cells in an even-numbered NAND string. However, the subsequently programmed memory cells in the odd-numbered NAND strings will generally tend to pull up the Vt level of the previously programmed memory cells in the even-numbered NAND string due to capacitive coupling between the floating gates of the subsequently programmed memory cells in the odd-numbered NAND strings and the previously programmed memory cells in the even-numbered NAND string.

The increase in the Vt level may act to cause problems in that the increase in the program Vt level can change the data value of a programmed cell. For example, multi-level memory cells generally have different program Vt level ranges, e.g., of 200 mV for each range, with each range corresponding to a distinct data state, thereby representing different data values or bit patterns, and a capacitive-coupling-induced increase in the Vt level could change those data values.

For the reasons stated above, and for other reasons stated below which will become apparent to those skilled in the art upon reading and understanding the present specification, there is a need in the art for alternatives to existing bit line configurations.

BRIEF DESCRIPTION OF THE DRAWINGS

FIG. 5A illustrates a portion of a row of memory cells at stage of programming, according to another embodiment of the disclosure.

FIG. 5B illustrates the portion of a row of memory cells of FIG. 5A at a different stage of programming, according to another embodiment of the disclosure.

DETAILED DESCRIPTION

Figure 1:
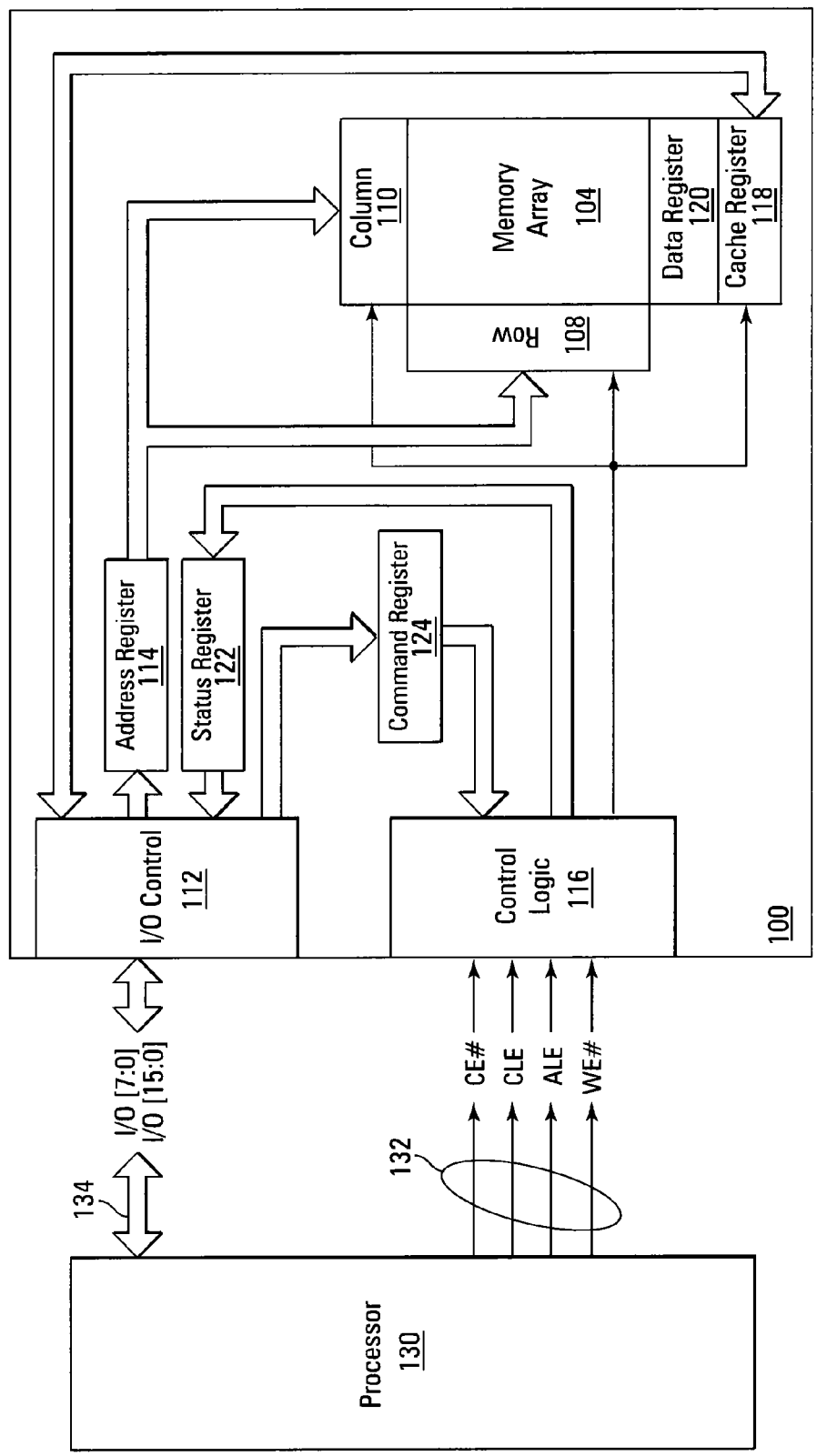
FIG. 1 is a simplified block diagram of an embodiment of a NAND flash memory device, according to an embodiment of the disclosure.

In the following detailed description, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present disclosure. The following detailed description is, therefore, not to be taken in a limiting sense, and the scope of the present disclosure is defined only by the appended claims and equivalents thereof.

FIG. 1 is a simplified block diagram of a NAND flash memory device 100 in communication with a processor 130 as part of an electronic system, according to an embodiment. The processor 130 may be a memory controller or other external host device. Memory device 100 includes an array of memory cells 104, such as non-volatile, e.g., floating-gate, memory cells, in accordance with embodiments of the disclosure. For example, alternating pairs of data lines (e.g., bit lines) of memory array 104 are inverted pairs of data lines, according to the various embodiments of the disclosure.

A row decoder 108 and a column decoder 110 are provided to decode address signals. Address signals are received and decoded to access memory array 104. Input/output (I/O) control circuitry 112 is provided to manage input of commands, addresses and data to the memory device 100 as well as output of data and status information from the memory device 100. An address register 114 is in communication with I/O control circuitry 112, row decoder 108, and column decoder 110 to latch the address signals prior to decoding. A command register 124 is in communication with I/O control circuitry 112 and control logic 116 to latch incoming commands. Control logic 116 controls access to the memory array 104 in response to the commands and generates status information for the external processor 130. The control logic 116 is in communication with row decoder 108 and column decoder 110 to control the row decoder 108 and column decoder 110 in response to the addresses.

Control logic 116 is also in communication with a cache register 118. Cache register 118 latches data, either incoming or outgoing, as directed by control logic 116 to temporarily store data while the memory array 104 is busy writing or reading, respectively, other data. For one embodiment, control logic 116 may include one or more circuits adapted to produce a particular and predictable outcome or set of outcomes in response to one or more input events. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130. For another embodiment, control logic 116 is configured to program memory 116 in accordance with various embodiments of the disclosure.

Memory device 100 receives control signals at control logic 116 from processor 130 over a control link 132. The control signals may include at least chip enable CE#, a command latch enable CLE, an address latch enable ALE, and a write enable WE#. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [0:7] of I/O bus 134 at I/O control circuitry 112 and are written into command register 124. The addresses are received over input/output (I/O) pins [0:7] of bus 134 at I/O control circuitry 112 and are written into address register 114. The data are received over input/output (I/O) pins [0:7] for an 8-bit device or input/output (I/O) pins [0:15] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [0:7] for an 8-bit device or input/output (I/O) pins [0:15] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
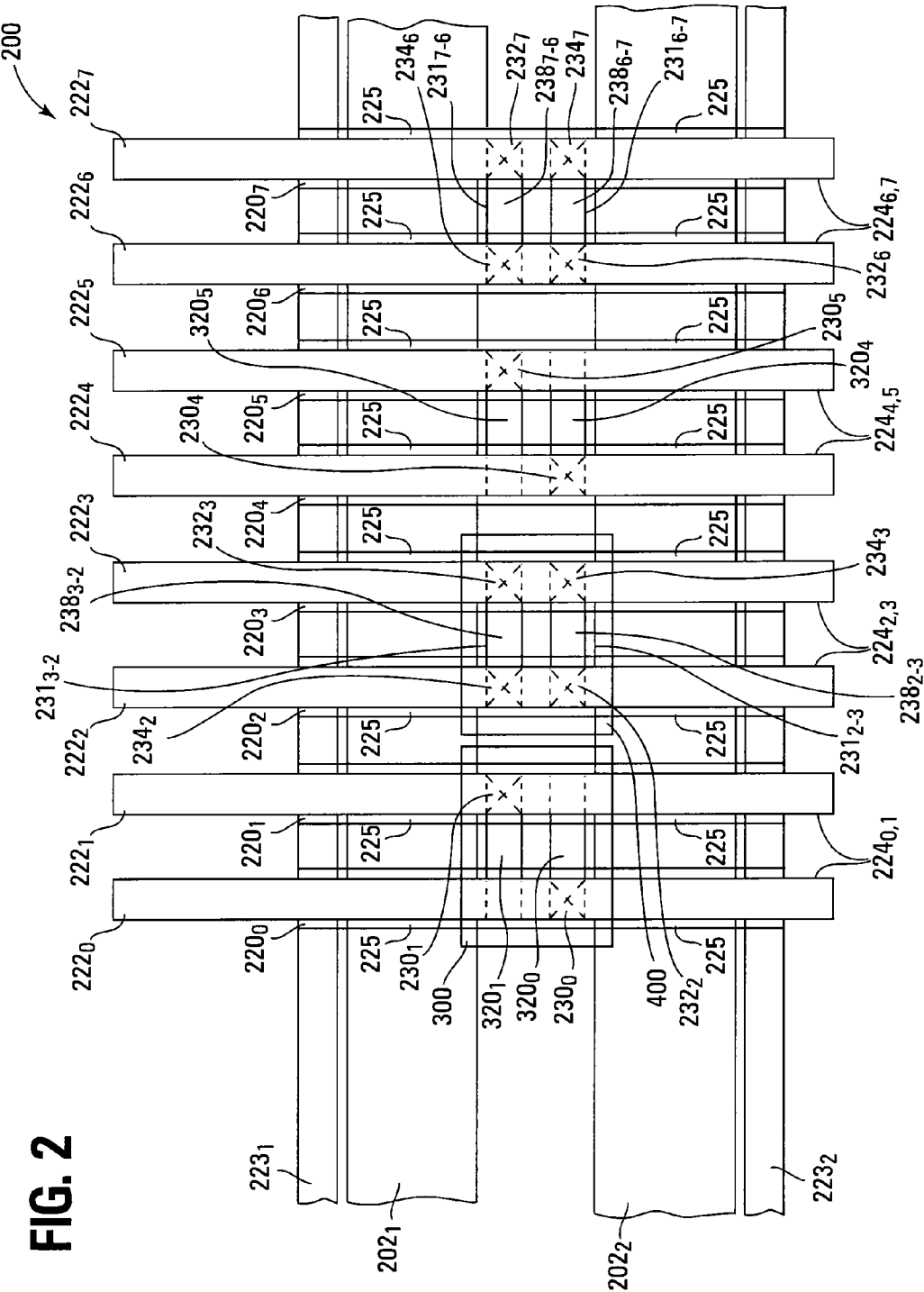
FIG. 2 is a plan view of an embodiment of a memory array, according to another embodiment of the disclosure.

FIG. 2 is a plan view of a memory array 200, such as a portion of memory array 104 of FIG. 1, according to an embodiment. Memory array 200 may include blocks of memory cells, such as memory blocks $202_1$ and $202_2$, organized in logical rows and columns, such as columns $220_0$ to $220_7$, where an even-numbered subscript denotes an even-numbered column 220 and an odd-numbered subscript denotes an odd-numbered column 220. For one embodiment, each column 220 includes one or more strings 225 of memory cells, such as a NAND strings, coupled in series, source-to-drain. For one embodiment, each string 225 may include floating gate transistors that represent non-volatile memory cells for storage of data. The floating gate transistors of each NAND string are connected in series, source to drain, between a source select gate and a drain select gate (not shown in FIG. 2).

For one embodiment, a data line, such as a bit line 222, is formed directly overlying a column 220. For example, bit lines $222_0$ to $222_7$ respectively directly overlie columns $220_0$ to $220_7$, where an even-numbered subscript denotes an even-numbered bit line 222 and an odd-numbered subscript denotes an odd-numbered bit line 222. For example, bit lines $222_0$ to $222_7$ directly overlie and are aligned with columns $220_0$ to $220_7$ on a one-to-one basis.

For one embodiment, an even and odd data line (e.g., bit line) forms a data-line pair (e.g., a bit-line pair). For example, bit lines $222_0$ and $222_1$, bit lines $222_2$ and $222_3$, bit lines $222_4$ and $222_5$, and bit lines $222_6$ and $222_7$ respectively form bit-line pairs $224_{0,1}$, $224_{2,3}$, $224_{4,5}$, and $224_{6,7}$. For another embodiment, bit-line pairs $224_{0,1}$, $224_{2,3}$, $224_{4,5}$, and $224_{6,7}$ may be selectively coupled one-to-one to sense amplifiers (not shown) by select gates (not shown in FIG. 2), as is known by those skilled in the art. For example, the bit lines may be coupled to a source/drain region (not shown in FIG. 2) of a drain select gate. As discussed below, for a further embodiment, bit-line pairs $224_{0,1}$ and $224_{4,5}$ are non-inverted (e.g., straight) bit-line pairs, and pairs $224_{2,3}$ and $224_{6,7}$ are inverted (e.g., twisted) bit-line pairs, meaning that the non-inverted and inverted bit-line pairs alternate so that there is a non-inverted bit-line pair interposed between a pair of inverted bit-line pairs.

For one embodiment, even and odd bit lines $222_0$ and $222_1$ of non-inverted bit-line pair $224_{0,1}$ are respectively electrically coupled to even and odd columns $220_0$ and $220_1$ by contacts $230_0$ and $230_1$ (e.g., referred to as bit-line contacts), and even and odd bit lines $222_4$ and $222_5$ of bit-line pair $224_{4,5}$ are respectively electrically coupled to even and odd columns $220_4$ and $220_5$ by contacts $230_4$ and $230_5$.

Figure 3:
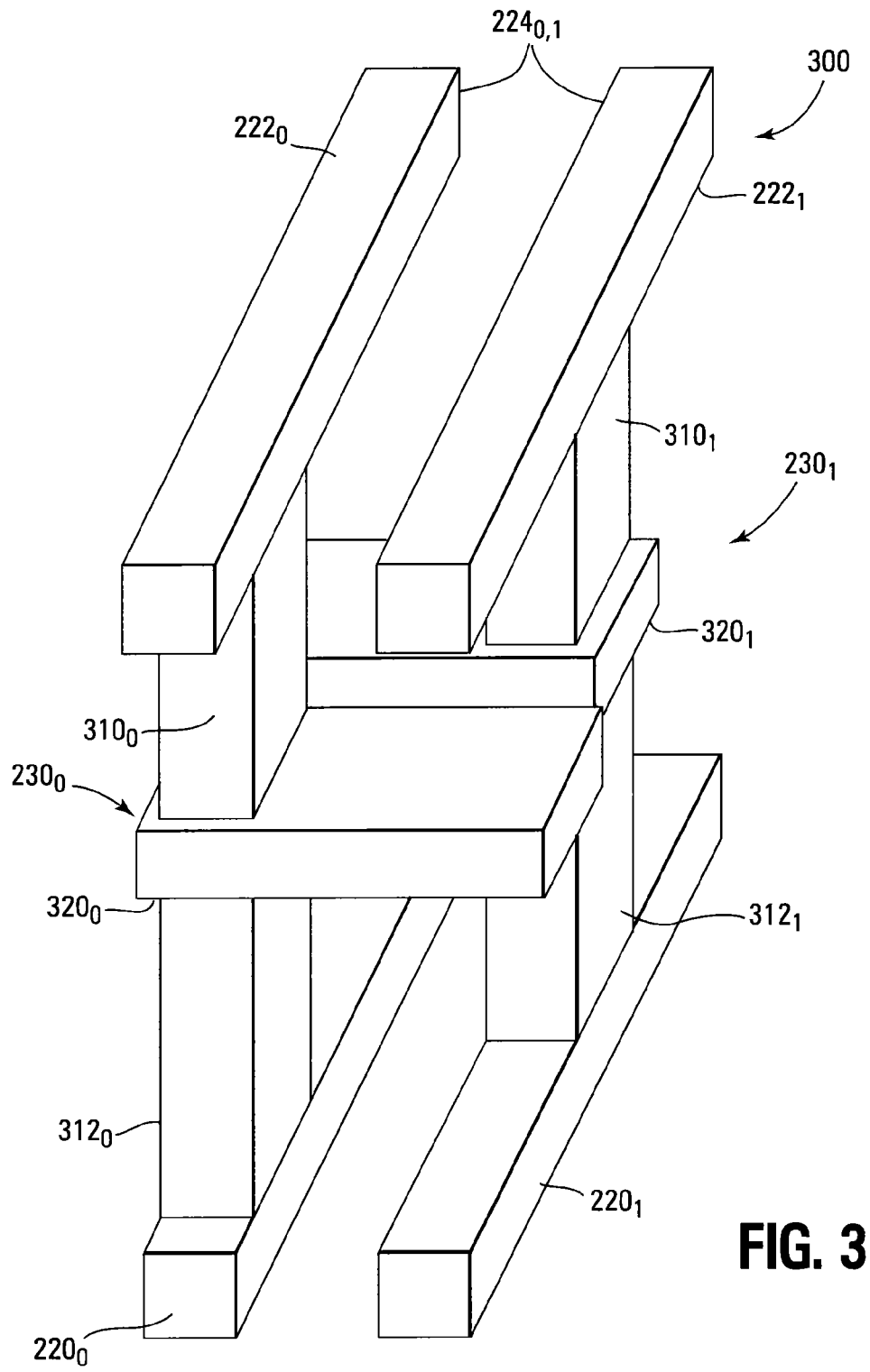
FIG. 3 is a pictorial view of region 300 of FIG. 2, illustrating an embodiment of a non-inverted data-line pair, according to another embodiment of the disclosure.

FIG. 3 is a pictorial view of region 300 of FIG. 2 showing an example of a coupling arrangement of non-inverted bit-line pair $224_{0,1}$ for coupling bit lines $222_0$ and $222_1$ to columns $220_0$ and $220_1$, according to another embodiment. The same coupling arrangement may be used for non-inverted bit-line pair $224_{4,5}$ for coupling bit lines $222_4$ and $222_5$ to columns $220_4$ and $220_5$.

As shown in FIG. 3, each bit line contact 230 may include a first contact 310, such as a via-plug, coupled between a bit line 222 and a conductive pad 320 (e.g., conductive pads $320_0$ and $320_1$ of FIGS. 2 and 3 and conductive pads $320_4$, and $320_5$ of FIG. 2) and a second contact 312, such as a via-plug, coupled between the conductive pad 320 and a column 220. For example, bit line contact $230_0$ may include a first contact $310_0$ formed in a via that extends from bit line $222_0$ to conductive pad $320_0$ and a second contact $312_0$ formed in a via that extends from conductive pad $320_0$ to column $220_0$. Similarly, bit line contact $230_1$ may include a first contact $310_1$ formed in a via that extends from bit line $222_1$ to conductive pad $320_1$ and a second contact $312_1$ formed in a via that extends from conductive pad $320_1$ to column $220_1$.

For one embodiment, conductive pad $320_0$ may extend from a location directly overlying column $220_0$ to a location directly overlying column $220_1$, and conductive pad $320_1$ may extend from a location directly overlying column $220_1$ to a location directly overlying column $220_0$ (FIGS. 2 and 3). Note, however, that while conductive pad $320_0$ is coupled to column $220_0$, conductive pad $320_0$ is not coupled to column $220_1$ and that while conductive pad $320_1$ is coupled to column $220_1$, conductive pad $320_1$ is not coupled to column $220_0$. Similarly, conductive pad $320_4$ may extend from a location directly overlying column $220_4$ to a location directly overlying column $220_5$, and conductive pad $320_5$ may extend from a location directly overlying column $220_5$ to a location directly overlying column $220_4$ (FIG. 2). Note, however, that while conductive pad $320_4$ is coupled to column $220_4$, conductive pad $320_4$ is not coupled to column $220_5$ and that while conductive pad $320_5$ is coupled to column $220_5$, conductive pad $320_5$ is not coupled to column $220_4$. In this manner, conductive pads 320 can conveniently utilize the same structure as conductive straps 238 (FIG. 4) during fabrication.

For another embodiment, conductive pads 320 are optional and each bit line contact may extend directly from its respective bit line 222 to its respective column 220. Note that for another embodiment, contacts $310_0$ and $312_0$ may be vertically aligned with bit line $222_0$ and column $220_0$, and contacts $310_1$ and $312_1$ may be vertically aligned with bit line $222_1$ and column $220_1$, as shown in FIG. 3.

For one embodiment, a first string 225 of each column 220 of a respective one of columns $220_0$, $220_1$, $220_4$, and $220_5$ may be coupled between a bit line contact 230 and a source line $223_1$ as a portion of memory block $202_1$, and a second string 225 of each column 220 of a respective one of columns $220_0$, $220_1$, $220_4$, and $220_5$ may be coupled between that bit line contact 230 and a source line $223_2$ as a portion of memory block $202_2$, as shown in FIG. 2. For one embodiment, each source line 223 may be diffusion region formed in a slot in a substrate on which memory array 200 is formed.

For another embodiment, alternating bit-line pairs 222 are inverted bit-line pairs, e.g., every other bit-line pair 222 is an inverted bit-line pair with a non-inverted bit-line pair interposed therebetween. For example, even and odd bit lines $222_2$ and $222_3$ of inverted bit-line pair $224_{2,3}$ are respectively electrically coupled to odd and even columns $220_3$ and $220_2$ by inverter-bit-line-contacts $231_{2-3}$ and $231_{3-2}$, and even and odd bit lines $222_6$ and $222_7$ of inverted bit-line pair $224_{6,7}$ are respectively electrically coupled to odd and even columns $220_7$ and $220_6$ by inverter-bit-line-contacts $231_{6-7}$ and $231_{7-6}$, as shown in FIG. 2.

During operation, for one embodiment, inverter-bit-line-contacts $231_{2-3}$ and $231_{6-7}$ allow memory cells in odd columns $220_3$ and $220_7$ coupled to an access line (e.g., a word line) to be programmed in response to applying a program voltage to the word line and a certain potential, such as zero volts, respectively to even bit lines $222_2$ and $222_6$. Similarly, inverter-bit-line-contacts $231_{3-2}$ and $231_{7-6}$ allow memory cells in even columns $220_2$ and $220_6$ coupled to the word line to be programmed in response to applying the program voltage to the word line and the certain potential respectively to odd bit lines $222_3$ and $222_7$.

Figure 4:
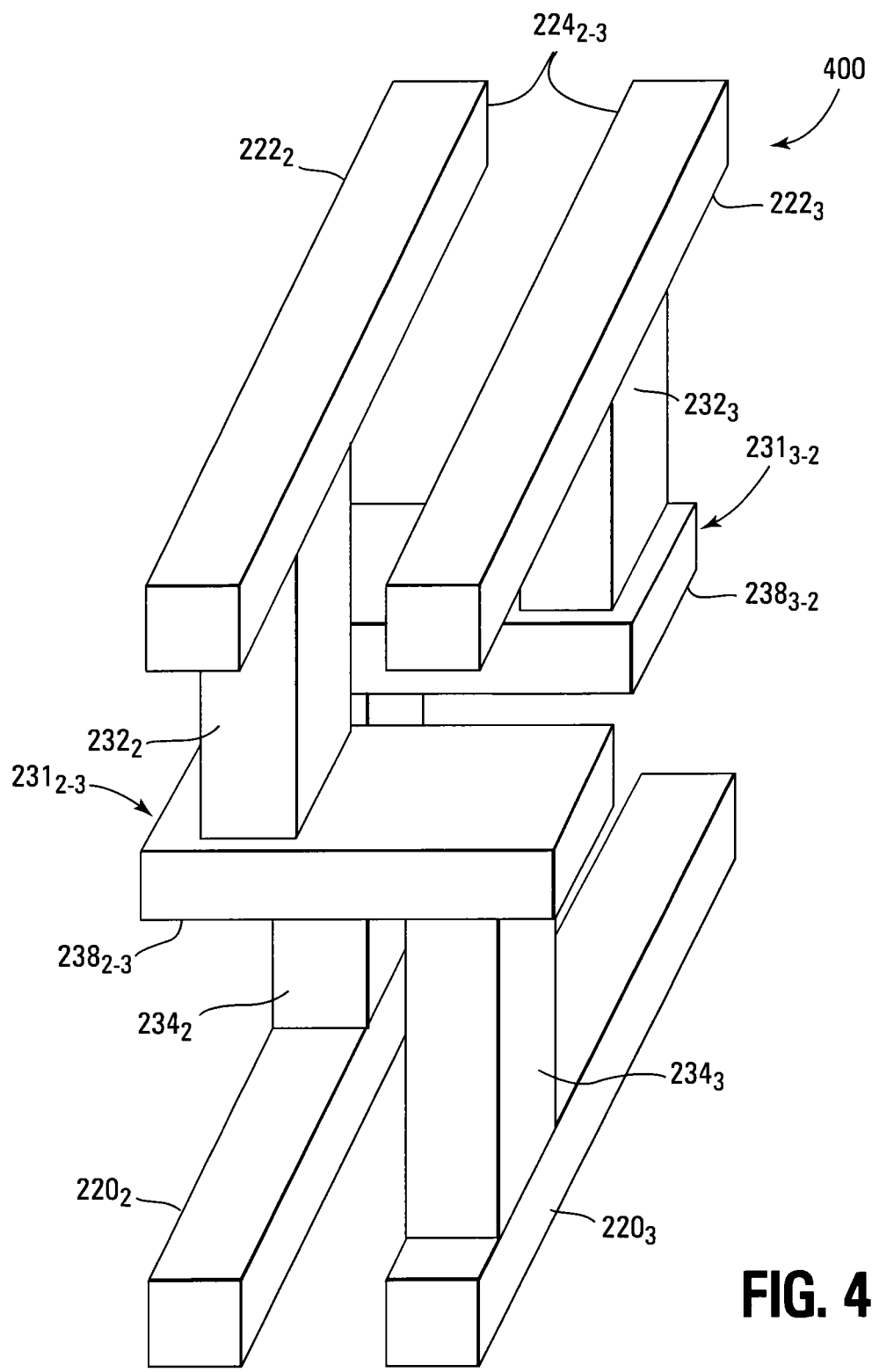
FIG. 4 is a pictorial view of region 400 of FIG. 2, illustrating an embodiment of an inverted data-line pair, according to another embodiment of the disclosure.

FIG. 4 is a pictorial view of region 400 of FIG. 2 of inverted bit-line pair $224_{2,3}$ for coupling bit lines $222_2$ and $222_3$ respectively to columns $220_3$ and $220_2$. As shown in FIGS. 2 and 4, an inverter-bit-line-contact 231 may include a first contact 232, such as a via-plug, coupled between an odd or even bit line 222 and a conductive strap 238 (e.g., conductive straps $238_{2-3}$ and $238_{3-2}$ of FIGS. 2 and 4 and conductive straps $238_{6-7}$ and $238_{7-6}$ of FIG. 2) of that inverter-bit-line-contact 231 and a second bit line contact 234, such as a via-plug, coupled between the conductive strap 238 and an even or odd column 220. Note that each conductive strap 238 extends between even- and odd-numbered columns. For one embodiment, conductive straps 238 and conductive pads 320 (FIG. 3) are formed from a common, e.g., the same, conductive layer, such as a metal layer.

In the example of FIG. 4, inverter-bit-line-contact $231_{2-3}$ may include first contact $232_2$ formed in a via that extends (e.g., substantially vertically) from even bit line $222_2$ to conductive strap $238_{2-3}$ of inverter-bit-line-contact $231_{2-3}$. Conductive strap $238_{2-3}$ extends from a location directly overlying even column $220_2$ to a location directly overlying odd column $220_3$. A second bit line contact $234_3$ of inverter-bit-line-contact $231_{2-3}$ is formed in a via that extends (e.g., substantially vertically) from conductive strap $238_{2-3}$ to odd column $220_3$. Similarly, inverter-bit-line-contact $231_{3-2}$ may include first contact $232_3$ formed in a via that extends (e.g., substantially vertically) from odd bit line $222_3$ to conductive strap $238_{3-2}$ of inverter-bit-line-contact $231_{3-2}$. Conductive strap $238_{3-2}$ extends from a location directly overlying odd column $220_3$ to a location directly overlying column $220_2$. A second contact $234_2$ of inverter-bit-line-contact $231_{3-2}$ is formed in a via that extends (e.g., substantially vertically) from the conductive strap $238_{3-2}$ to even column $220_2$.

Note, for example, that for one embodiment, first contact $232_2$ of inverter-bit-line-contact $231_{2-3}$ may be aligned directly vertically above column $220_2$; second contact $234_3$ of inverter-bit-line-contact $231_{2-3}$ may be aligned directly vertically above column $220_3$; and conductive strap $238_{2-3}$ is coupled between first contact $232_2$ and second contact $234_3$, as shown in FIG. 4, and extends from a location directly underlying even bit line $222_2$ to a location directly underlying odd bit line $222_3$, as shown in FIG. 2. Similarly, first contact $232_3$ of inverter-bit-line-contact $231_{3-2}$ may be aligned directly vertically above column $220_3$; second contact $234_2$ of inverter-bit-line-contact $231_{3-2}$ may be aligned directly vertically above column $220_2$; and conductive strap $238_{3-2}$ is coupled between first contact $232_3$ and second contact $234_2$, as shown in FIG. 4, and extends from a location directly underlying even bit line $222_2$ to a location directly underlying odd bit line $222_3$. Note that the conductive straps 238 extend from a location directly underlying an even bit line to a location directly underlying an odd bit line in a direction substantially perpendicular to the even and odd bit lines. For example, the conductive straps 238 extend in a direction of access (e.g., word) lines (not shown) in FIG. 2 of the memory blocks 202. Also note that for another embodiment, contacts $232_2$ and $234_2$ may be vertically aligned with bit line $222_2$ and column $220_2$, and contacts $232_3$ and $234_4$ may be vertically aligned with bit line $222_3$ and column $220_3$, as shown in FIG. 4.

For one embodiment, a first string 225 of each column 220 of a respective one of columns $220_2$, $220_3$, $220_6$, and $220_7$ may be coupled between a second contact 234 (respective ones of second contacts $234_2$, $234_3$, $234_6$, and $234_7$) and source line $223_1$ as a portion of memory block $202_1$, and a second string 225 of each column 220 of a respective one of columns $220_2$, $220_3$, $220_6$, and $220_7$ may be coupled between that second contact 234 and source line $223_2$ as a portion of memory block $202_2$, as shown in FIG. 2.

For one embodiment, a portion of memory array 200 may be formed by forming contacts $312_0$, $312_1$, $234_2$, and $234_3$ respectively overlying and coupled to columns $220_0$, $220_1$, $220_2$, and $220_3$ (FIGS. 3 and 4). For example, contacts $312_0$, $312_1$, $234_2$, and $234_3$ may be via plugs substantially concurrently formed in vias in a dielectric layer (not shown) overlying columns $220_0$, $220_1$, $220_2$, and $220_3$. Note that contacts $312_0$, $312_1$, $234_2$, and $234_3$ may be respectively formed in contact with source/drain regions of drain select gates respectively coupled in series with the strings 225 of columns $220_0$, $220_1$, $220_2$, and $220_3$.

Conductive pads $320_0$ and $320_1$ may then be formed overlying and respectively in contact with contacts $312_0$ and $312_1$. Conductive straps $238_{2-3}$ and $238_{3-2}$ may also be formed overlying and respectively in contact with contacts $234_3$ and $234_2$. For example, pads $320_0$ and $320_1$ and conductive straps $238_{2-3}$ and $238_{3-2}$ may be formed substantially concurrently by forming a conductive layer, e.g., of metal, overlying and in contact with contacts $312_0$, $312_1$, $234_2$, and $234_3$, e.g., and overlying and in contact with the dielectric layer overlying columns $220_0$, $220_1$, $220_2$, and $220_3$. Portions of the conductive layer may then be removed to form pads $320_0$ and $320_1$ and conductive straps $238_{2-3}$ and $238_{3-2}$ from the conductive layer.

Subsequently, contacts $310_0$ and $310_1$ may be formed respectively overlying and in contact with pads $320_0$ and $320_1$, and contacts $232_2$, and $232_3$ may be formed respectively overlying and in contact with conductive straps $238_{2-3}$ and $238_{3-2}$. For example, contacts $310_0$, $310_1$, $232_2$, and $232_3$ may be via plugs substantially concurrently formed in vias in a dielectric layer (not shown) overlying pads $320_0$ and $320_1$ and straps $238_{2-3}$ and $238_{3-2}$. Then, bit lines $222_0$, $222_1$, $222_2$, and $222_3$ are formed overlying and respectively in contact with contacts $310_0$, $310_1$, $232_2$, and $232_3$. For example, bit lines 222 may be formed from a conductive layer, e.g., of metal, (not shown), e.g., formed on the dielectric layer overlying pads $320_0$ and $320_1$ and straps $238_{2-3}$ and $238_{3-2}$.

FIGS. 5A and 5B illustrate a portion of a row of floating gate memory cells 520 of a memory array, such as memory array 200, at different stages of programming, according to another embodiment. The row of floating gate memory cells is coupled to an access line, such as word line 525, selected for programming. A program voltage, e.g., about 24 volts, is applied to word line 525.

Memory cell $520_3$ is part of a string 225 of column $220_3$ that is coupled to even bit line $222_2$; memory cell $520_4$ is part of a string 225 of column $220_4$ that is coupled to even bit line $222_4$; memory cell $520_5$ is part of a string 225 of column $220_5$ that is coupled to odd bit line $222_5$; and memory cell $520_6$ is part of a string 225 of column $220_6$ that is coupled to odd bit line $222_7$. Note that floating gates of adjacent memory cells are capacitively coupled. Note also that for one embodiment, the conductive straps 238 (FIG. 2) extend from a location directly underlying an even bit line to a location directly underlying an odd bit line in the direction of word line 525, substantially perpendicular to the direction of the bit lines.

In FIG. 5A, memory cells $520_5$ and $520_6$ are targeted for programming by applying a potential, e.g., about zero volts, respectively to bit lines $222_5$ and $222_7$ and by placing a potential, such as a voltage $V_0$, e.g., about zero volts, on channels $530_5$ and $530_6$ respectively of memory cells $520_5$ and $520_6$ while the program voltage is applied to selected word line 525. While the program voltage is applied to selected word line 525 and memory cells $520_5$ and $520_6$ are being programmed, memory cells $520_3$ and $520_4$ are inhibited from being programmed by applying an inhibit voltage to even bit lines $222_2$ and $222_4$ and by placing a potential, such as voltage $V_1$, e.g., of about 7 volts, on channels $530_3$ and $530_4$ respectively of memory cells $520_3$ and $520_4$. Note that memory cells $520_3$ and $520_4$ may already be programmed or they may be in an erased state, and thus it is desired that memory cells $520_3$ and $520_4$ be inhibited from being programmed further or from being programmed at all.

When the voltage $V_1$ is on a channel 530, such as channels $530_3$ and $530_4$ in FIG. 5A, the memory cell 520, such as memory cells $520_3$ and $520_4$ in FIG. 5A, corresponding to that channel is unlikely to program when the program voltage is applied to the word line 525 in that the difference between the program voltage and the voltage $V_1$ on that channel 530 (i.e., the voltage difference across the floating gate of the corresponding memory cell 520) makes it unlikely that the Vt level of corresponding memory cell 520 will change when the program voltage is applied to the selected word line 525. As such, for one embodiment, the memory cell 520 corresponding to a channel 530 that is at a voltage $V_1$ may be referred to as a "fully inhibited" memory cell.

When the voltage $V_0$ is on a channel 530, such as channels $530_5$ and $530_6$ in FIG. 5A, the memory cell 520, such as memory cells $520_5$ and $520_6$ in FIG. 5A, corresponding to that channel is likely to program when the program voltage is applied to the word line 525 in that the difference between the program voltage and the voltage $V_0$ on that channel 530 (i.e., the voltage difference across the floating gate of the corresponding memory cell 520) makes it likely that the Vt level of corresponding memory cell 520 will change when the program voltage is applied to the selected word line 525. As such, for one embodiment, the memory cell 520 corresponding to a channel 530 that is at a voltage $V_0$ may be referred to as a memory cell targeted for programming (e.g., a targeted memory cell).

Note that problems may occur if, for example, memory cell $520_6$ programs more quickly than memory cell $520_5$. For example, when memory cell $520_6$ reaches its intended Vt level and passes a program verify, memory cell $520_6$ may be "fully inhibited" from further programming while another program voltage is applied to selected word line 525 during a subsequent programming cycle to program memory cell $520_5$. For example, the inhibit voltage is applied to bit line $222_7$ and the voltage $V_1$ is placed on channel $530_6$ of memory cell $520_6$ while the program voltage is applied to selected word line 525, as shown in FIG. 5B. This leads to a sudden change in the programming environment of memory cell $520_5$ because during the prior programming cycle, neighboring memory cell $520_6$ had voltage $V_0$ on its channel $530_6$ while it now has voltage $V_1$ on its channel $530_6$, which will increase the capacitive coupling effect for the present programming cycle. Because of this step increase in capacitive coupling between the floating gates of memory cells $520_5$ and $520_6$, the Vt level of memory cell $520_5$ may shift at an increased rate over the prior programming cycle, possibly resulting in over-programming of the memory cell $520_5$.

Figure 6:
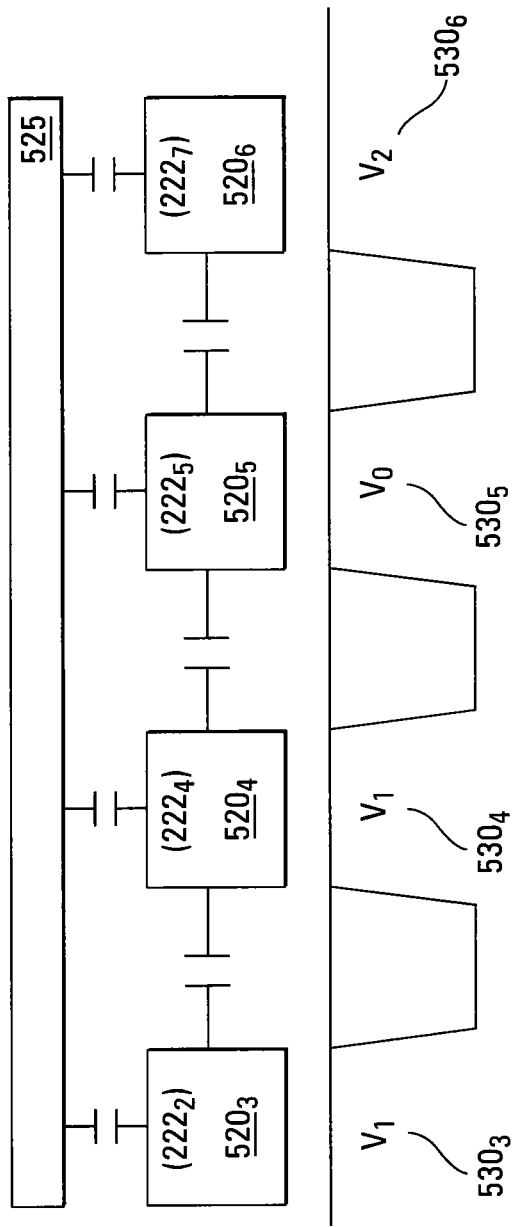
FIG. 6 illustrates the portion of a row of memory cells of FIG. 5A with at least one memory cell partially inhibited during programming, according to another embodiment of the disclosure.

For one embodiment, the likelihood of an undesirable increase in the Vt level of memory cell $520_5$ due to the capacitive coupling between the floating gates of memory cells $520_5$ and $520_6$ might be reduced by placing a reduced potential on channel $530_6$ while the program voltage is applied to selected word line 525 to program memory cell $520_6$ during a subsequent program cycle, as shown in FIG. 6. This reduced potential, such as a voltage $V_2$, is chosen to be between $V_0$ and $V_1$, e.g., about 2.5 volts for this example. For one embodiment, the voltage of channel $530_6$ is at the voltage $V_2$ during only the one programming cycle after verifying memory cell $520_6$. For subsequent programming cycles, memory cell $520_6$ would be treated as a "fully inhibited" memory cell.

When the voltage $V_2$ is on a channel 530, e.g., channel $530_6$, and the program voltage is applied to the selected word line 525, the memory cell 520, e.g., memory cell $520_6$, corresponding to that channel is more likely to program than when the voltage $V_1$ is on that channel 530 and the program voltage is applied to the selected word line 525. That is, when voltage $V_2$ is on a channel $530_6$, it is more likely that the Vt level of the corresponding memory cell $520_6$ will change when the program voltage is applied to the selected word line 525 than when voltage $V_1$ is on channel $530_6$. This is because the presence of the voltage $V_2$ results in a larger voltage difference across the floating gate of memory cell $520_6$ than the voltage $V_1$. When the voltage $V_2$ is on a channel $530_6$, the likelihood of memory cell $520_6$ programming is less than the likelihood of memory cell $520_6$ programming when the voltage $V_0$ is on a channel $530_6$. For example, when the voltage $V_2$ is on a channel $530_6$, the Vt level of memory cell $520_6$ may change, but by a lesser amount than when the voltage $V_0$ is on a channel $530_6$. That is, the presence voltage $V_2$ on a channel $530_6$ acts to slow the programming of memory cell $520_6$ compared to when $V_0$ is on a channel $530_6$. As such, for one embodiment, the memory cell 520 corresponding to channel 530 that is at a voltage $V_2$ may be referred to as a "partially inhibited" memory cell. Note that the voltages $V_1$ and $V_2$ may be applied to the respective channels using a self-boosting scheme, according to one embodiment, as indicated in the examples below.

Figure 7A:
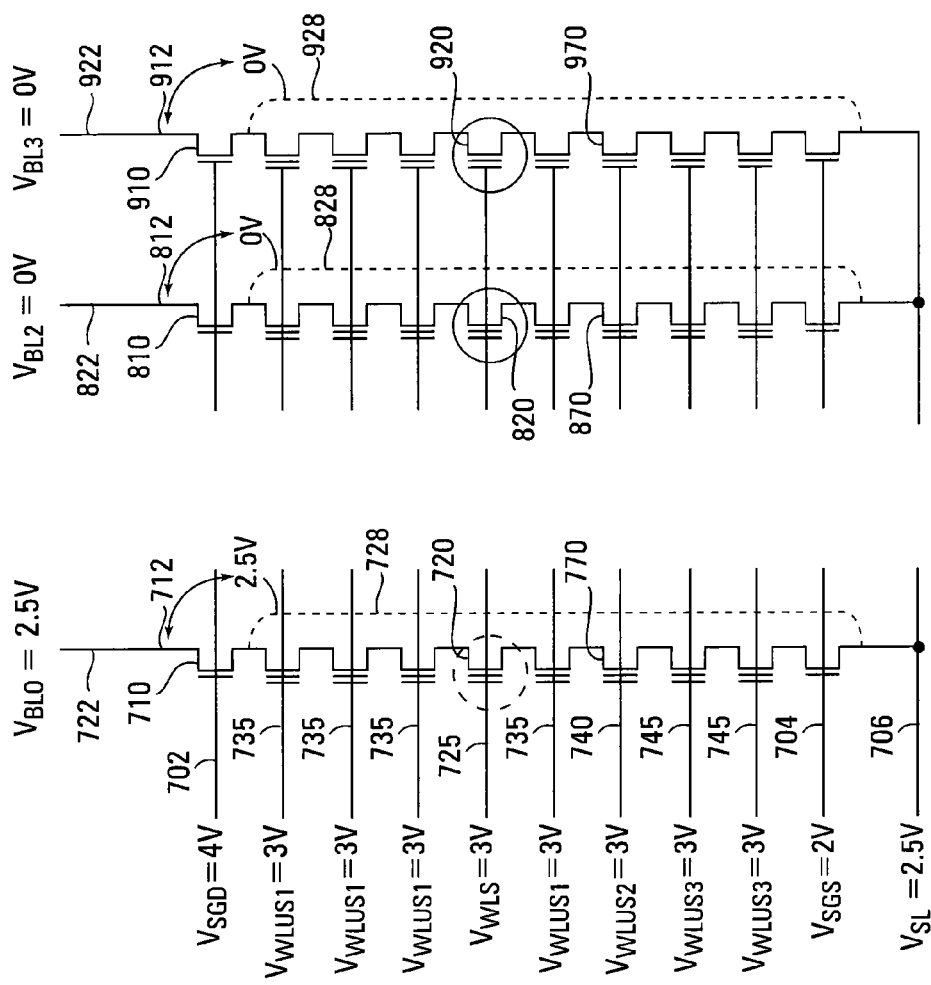
FIGS. 7A-7E show portions of a memory array at various stages during a programming cycle, according to another embodiment of the disclosure.
Figure 7B:
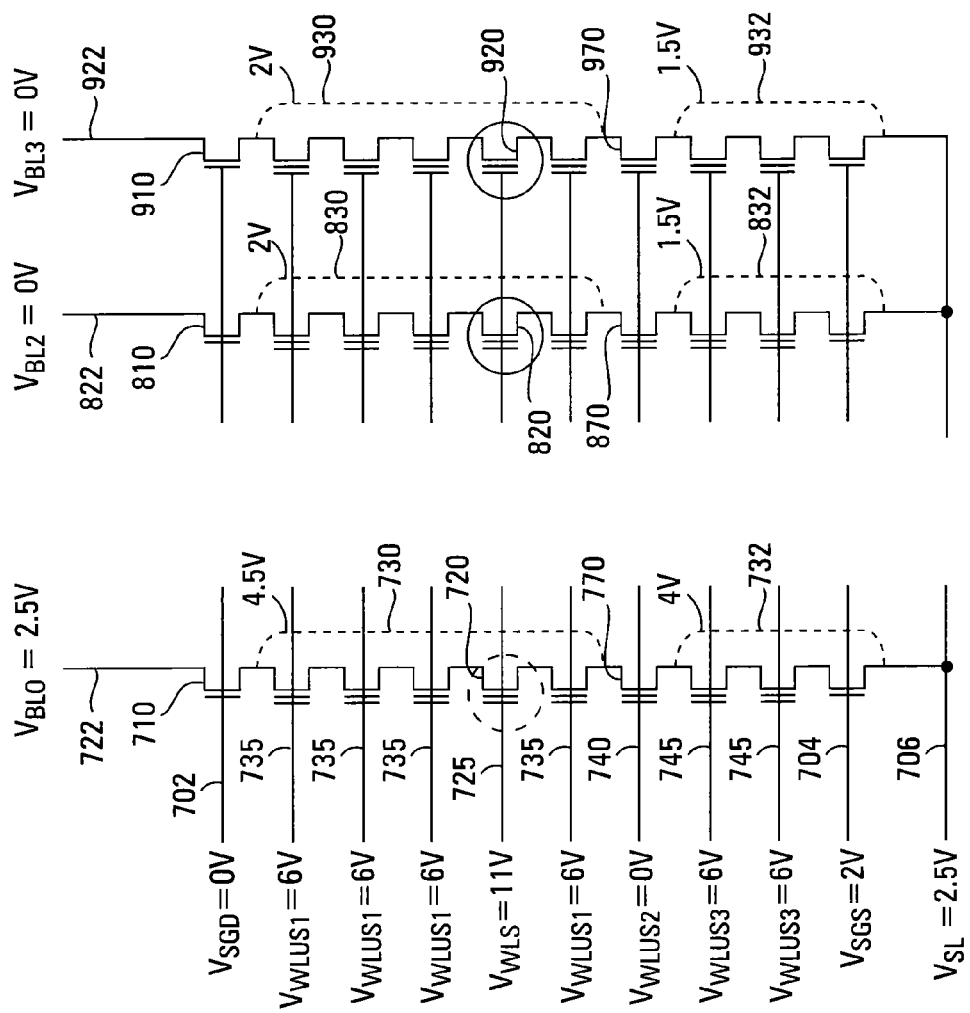
Figure 7C:
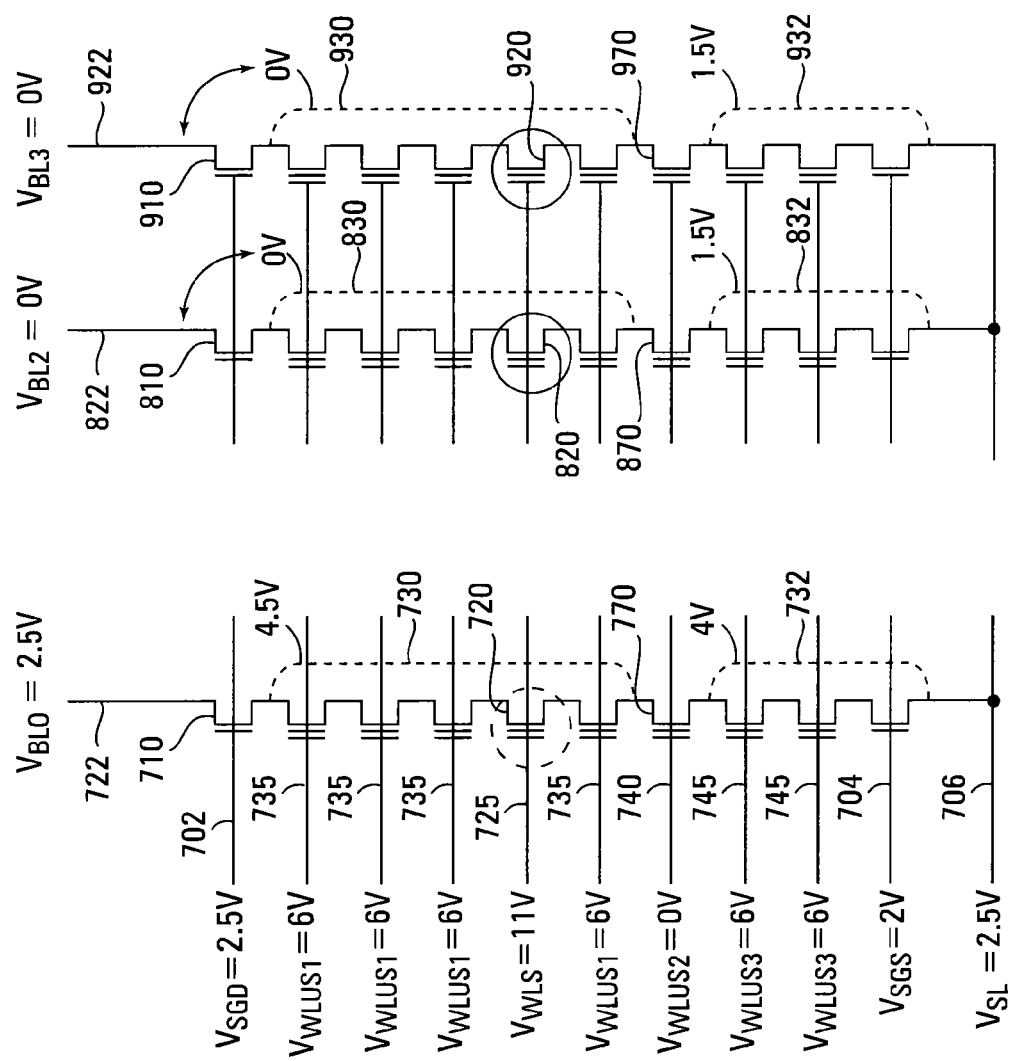
Figure 7D:
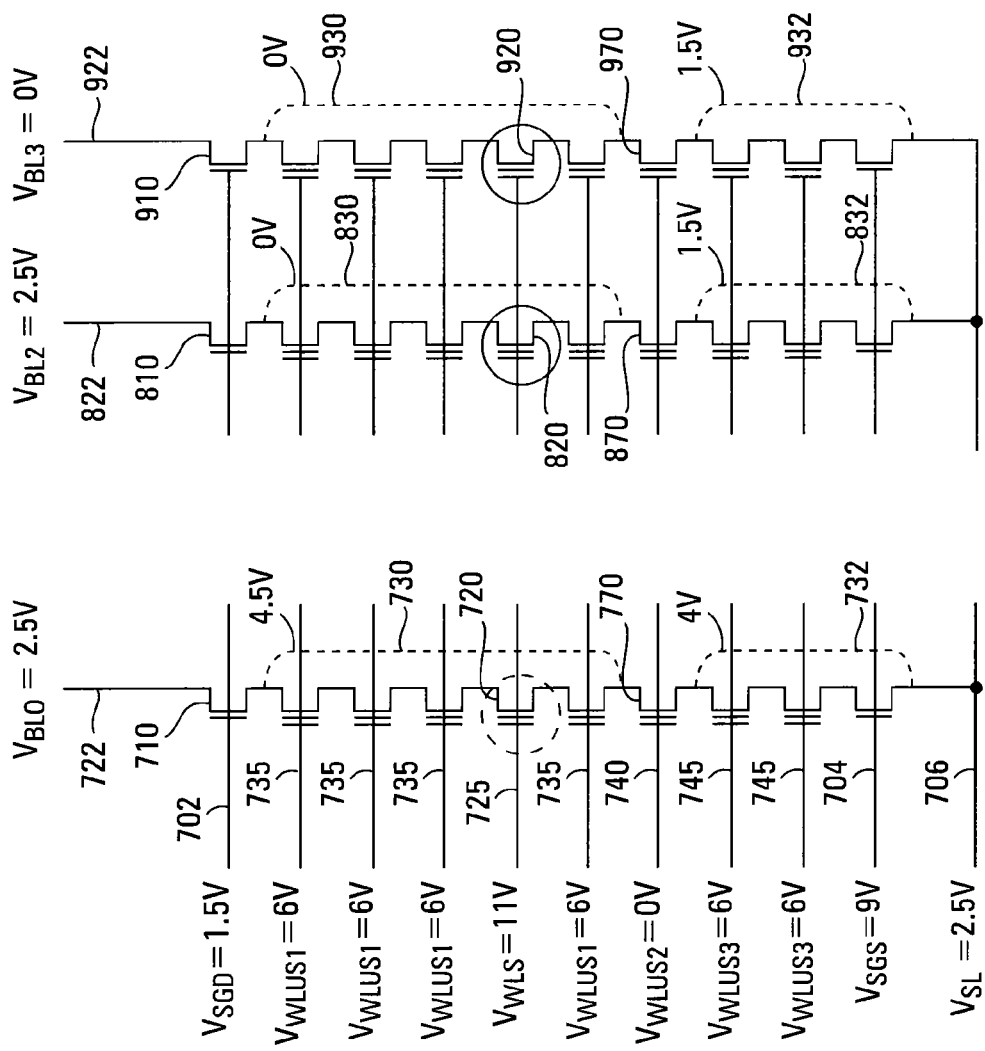
Figure 7E:
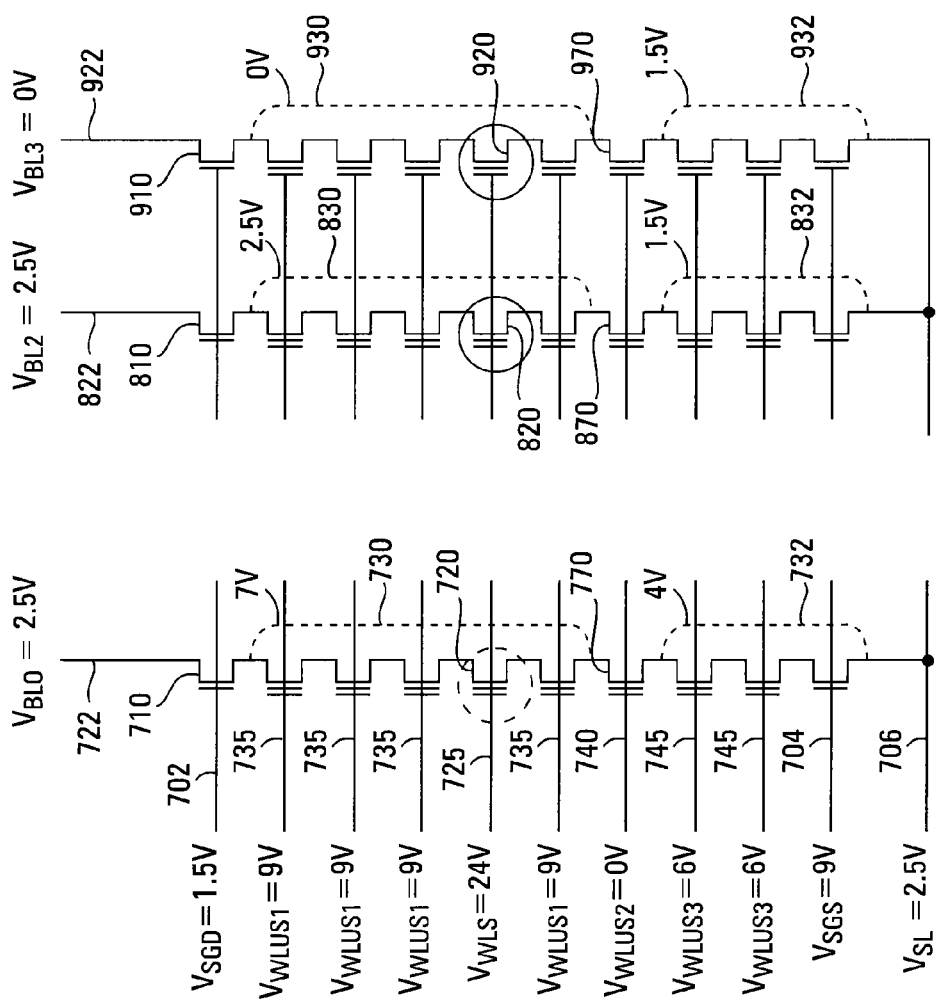
Figure 8:
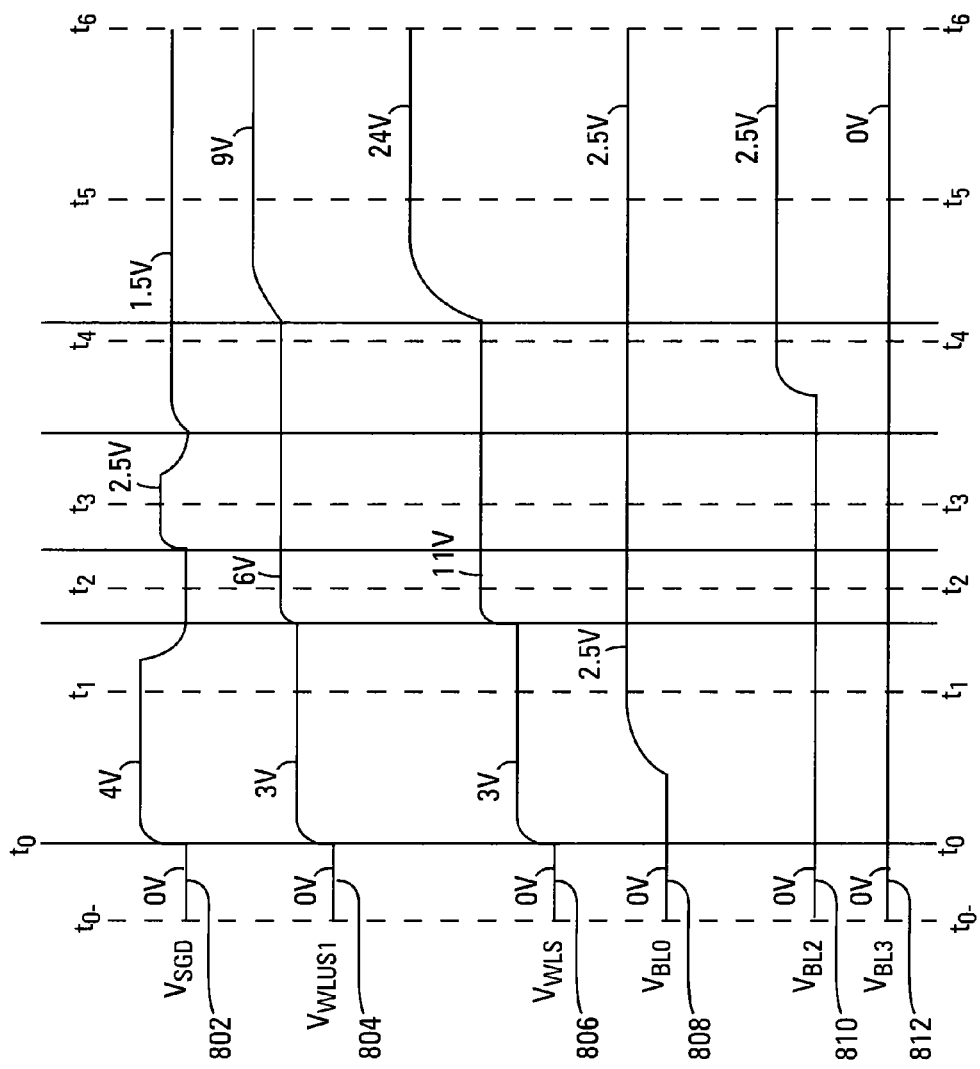
FIG. 8 illustrates waveforms applied to the portions of the memory array during the programming cycle of FIGS. 7A-7E, according to another embodiment of the disclosure.

FIGS. 7A-7E show portions of a memory array, such as portions of a memory block 202 of memory array 200, at different stages during a programming cycle, according to another embodiment. For example, FIGS. 7A-7E respectively correspond to the states occurring at times $t_1$-$t_5$ of FIG. 8, where FIG. 8 shows waveforms 802, 804, 806, 808, 810, and 812, respectively, indicative of the time-wise variation of the voltages $V_{SGD}$, $V_{WLUS1}$, $V_{WLS}$, $V_{BL0}$, $V_{BL2}$, and $V_{BL3}$ during the programming cycle. Voltages $V_{SGD}$, $V_{SGS}$, $V_{SL}$, $V_{BL0}$, $V_{BL2}$, $V_{BL3}$, and $V_{WLS}$ are respectively applied to a drain select line 702, a source select line 704, a source line 706, a bit line 722, a bit line 822, a bit line 922, and a selected word line 725 (FIGS. 7A-7E). Voltage $V_{WLUS1}$ is applied to each of unselected word lines 735 of FIGS. 7A-7E. In addition, the voltage $V_{WLUS2}$ is applied to unselected word line 740, and voltages $V_{WLUS3}$ are applied to unselected word lines 745, as shown in FIGS. 7A-7E. Note that the time-wise behavior of voltage $V_{SGS}$, voltage $V_{SL}$, voltage $V_{WLUS2}$, and of voltages $V_{WLUS3}$ is not shown in FIG. 8.

It is desired that a memory cell 720 coupled to selected word line 725 and bit line 722 not be programmed during the programming cycle illustrated in FIGS. 7A-7E and is thus an untargeted memory cell. For example, untargeted memory cell 720 may have been verified as being programmed during a previous programming cycle or untargeted memory cell 720 may be in an erased state and waiting to be programmed during later programming cycles. As such, memory cell 720 is "fully inhibited" while a program voltage is applied to selected word line 725. FIGS. 7A-7E and FIG. 8 provide an example illustration of how memory cell 720 is "fully inhibited" and thus provide an example of how memory cells $520_3$, $520_4$, and $520_6$ of FIGS. 5A and 5B may be "fully inhibited."

A memory cell 920 coupled to selected word line 725 and the bit line 922 is targeted for programming during the programming cycle illustrated in FIGS. 7A-7E and FIG. 8 and is thus a targeted memory cell. The programming of targeted memory cell 920 is an example of how memory cells $520_3$, $520_4$, $520_5$, and $520_6$ of FIGS. 5A, 5B, and 6 might be programmed.

It is desired that a memory cell 820 coupled to selected word line 725 and bit line 822 not be programmed during the programming cycle illustrated in FIGS. 7A-7E and is thus an untargeted memory cell. For example, untargeted memory cell 820 may be part of a string of memory cells successively adjacent a string of memory cells containing targeted memory cell 920, where it is desired to reduce the capacitive coupling between the floating gates of untargeted memory cell 820 and targeted memory cell 920 compared to a case where untargeted memory cell 820 is "fully inhibited." As such, untargeted memory cell 820 is "partially inhibited" while the program voltage is applied to selected word line 725. Therefore, FIGS. 7A-7E and FIG. 8 provide an example illustration of how a memory cell, such as memory cell $520_6$, might be partially inhibited.

At a time $t_0$ before applying the program cycle to selected word line 525, all of the voltages $V_{SGD}$, $V_{WLS}$, $V_{BL0}$, $V_{BL2}$, $V_{BL3}$, $V_{SGS}$, $V_{SL}$, $V_{WLUS1}$, $V_{WLUS2}$, and $V_{WLUS3}$ are at about zero volts, as shown in FIG. 8. The programming cycle commences at time $t_0$ (e.g., =0). At time $t_1$ (see FIGS. 7A and 8) of the programming cycle, the voltage $V_{SGD}$ applied to drain select line 702 is about 4 volts, which activates the drain select gates 710, 810, and 910 coupled to drain select line 702. The voltage $V_{BL0}$ applied to bit line 722 is about 2.5 volts at time $t_1$, while the voltages $V_{BL2}$ and $V_{BL3}$ respectively applied to bit lines 822 and 922 are about zero volts.

Activation of drain select gate 710 coupled to bit line 722 and the 2.5 volts applied to bit line 722 places about 2.5 volts on a channel 728 of the string of memory cells coupled to bit line 722. Activation of drain select gates 810 and 910 respectively coupled to bit lines 822 and 922 and the zero volts applied to bit lines 822 and 922 places about zero volts on channels 828 and 928 respectively of the strings of memory cells coupled to bit lines 822 and 922. Note that for one embodiment, bit lines 722, 822, and 922, may be respectively in contact with source/drain regions 712, 812, and 912 respectively of drain select gates 710, 810, and 910.

At time $t_2$ (see FIGS. 7B and 8), the voltage $V_{SGD}$ applied to drain select line 702 is about zero volts so that drain select gates 710, 810, and 910 are deactivated, thereby isolating the voltages $V_{BL0}$, $V_{BL2}$, and $V_{BL3}$ respectively applied to bit lines 722, 822, and 922 from the memory cells coupled to bit lines 722, 822, and 922. At time $t_2$, the voltages $V_{BL1}$, $V_{BL2}$, and $V_{BL3}$ are respectively about 2.5 volts, zero volts, and zero volts. Meanwhile, the voltage $V_{WLUS1}$ applied to unselected word lines 735 is at about six volts; the voltage $V_{WLUS2}$ applied to unselected word line 740 is zero volts; the voltage $V_{WLUS3}$ applied to unselected word lines 745 is at about six volts; and the voltage $V_{WLS}$ applied to selected word line 725 is at about 11 volts.

For one embodiment, the memory cells 770, 870, and 970 coupled to unselected word line 740 are called "blocking" memory cells, for example. A "blocking" memory cell is typically used to divide the channel of a string of memory cells into two or more sections to isolate memory cells and/or string sections. For example, "blocking" memory cell 770 divides channel 728 into channels 730 and 732; "blocking" memory cell 870 divides channel 828 into channels 830 and 832; and "blocking" memory cell 970 divides channel 928 into channels 930 and 932 (FIG. 7B). As such, the memory cells corresponding to channels 730 and 732 are isolated from each other, as are the memory cells corresponding to channels 830 and 832 and the memory cells corresponding to channels 930 and 932. Since the focus of the examples illustrated in FIGS. 7A-7E and FIG. 8 is on memory cells 720, 820, and 920 with channels 730, 830, and 930, the remainder of the discussion will be directed to channels 730, 830, and 930 and the portions of the strings of memory cells coupled thereto.

At time $t_2$, the voltage $V_{WLUS1}$ of about 6 volts applied to unselected word lines 735 and voltage $V_{WLS}$ of about 11 volts applied to selected word line 725 act to increase (e.g., boost) the voltages of channels 730, 830, and 930 by about two volts, for example. As such, channels 730, 830, and 930 are respectively at about 4.5 volts, 2 volts, and 2 volts, as shown in FIG. 7B.

At time $t_3$ (see FIGS. 7C and 8), the voltages $V_{BL1}$, $V_{BL2}$, and $V_{BL3}$ respectively applied to bit lines 722, 822, and 922 are respectively at about 2.5 volts, zero volts, and zero volts (the same as at time $t_2$); the voltage $V_{WLUS1}$ applied to unselected word lines 735 is at about six volts (the same as at time $t_2$); and the voltage $V_{WLS}$ applied to selected word line 725 is at about 11 volts (the same as at time $t_2$). The voltage $V_{SGD}$ applied to drain select line 702 is at about 2.5 volts at time $t_3$. Placing about 2.5 volts on drain select line 702 activates drain select gates 710, 810, and 910 respectively coupled to bit lines 722, 822, and 922. Activating drain select gates 810 and 910 acts to cause current flow from channels 830 and 930 respectively through drain select gates 810 and 910 and respectively to bit lines 822 and 922 (respectively at about zero volts) until the voltages on each of channels 830 and 930 are about zero volts, as shown in FIG. 7C. However, since both drain select line 702, and thus the control gate of drain select gate 710, and bit line 722, and thus the drain of drain select gate 710, are at about 2.5 volts there is no current flow from channel 730 through drain select gate 710 to bit line 722, meaning that the voltage on channel 730 remains at about 4.5 volts at time $t_3$.

At time $t_4$ (see FIGS. 7D and 8), the voltages $V_{BL1}$, $V_{BL2}$, and $V_{BL3}$ respectively applied to bit lines 722, 822, and 922 are respectively about 2.5 volts, 2.5 volts, and zero volts. The voltage $V_{SGD}$ applied to drain select line 702 is at about 1.5 volts at time $t_4$. Placing about 1.5 volts on drain select line 702 activates drain select gate 910 coupled to bit line 922. Activating drain select gate 910 couples bit line 922 (at about zero volts) to channel 930 and acts to maintain channel 930 at about zero volts, as shown in FIG. 7D. Since the drain select line 702, and thus the control gate of drain select gate 710, is at about 1.5 volts and bit line 722, and thus the drain of drain select gate 710, is at about 2.5 volts there is no current flow from channel 730 through drain select gate 710 to bit line 722, meaning that the voltage on channel 730 remains at about 4.5 volts at time $t_4$. The control gate of drain select gate 810 is also at about 1.5 volts and bit line 822, and thus the drain of drain select gate 810, is at about 2.5 volts so that there is no current flow from bit line 822 through drain select gate 810 to channel 830. Therefore, the voltage on channel 830 remains at about zero volts at time $t_4$. Also at time $t_4$, the voltage $V_{WLUS1}$ applied to unselected word lines 735 is at about six volts (the same as at time $t_3$), and the voltage $V_{WLS}$ applied to selected word line 725 is at about 11 volts (the same as at time $t_3$).

At time $t_5$ (see FIGS. 7E and 8), the voltages $V_{BL1}$, $V_{BL2}$, and $V_{BL3}$ respectively applied to bit lines 722, 822, and 922 are respectively at about 2.5 volts, 2.5 volts, and zero volts (the same as at time $t_4$). Also at time $t_5$, the voltage $V_{WLUS1}$ applied to unselected word lines 735 is at a pass voltage, e.g., of about nine volts, and the voltage $V_{WLS}$ applied to selected word line 725 is at the program voltage, e.g., of about 24 volts. The voltage $V_{WLUS1}$ of about nine volts applied to unselected word lines 735 and voltage $V_{WLS}$ of about 24 volts applied to selected word line 725 act to increase (e.g., boost) the voltages of channels 730 and 830 by about 2.5 volts, for example. As such, channels 730 and 830 are respectively at about 7 volts and 2.5 volts, as shown in FIG. 7E. The voltage $V_{SGD}$ applied to drain select line 702 is at about 1.5 volts (the same as at time $t_4$) at time $t_5$ so that drain select gate 910 coupled to bit line 922 is activated. Activated drain select gate 910 couples bit line 922 (at about zero volts) to channel 930 and acts to maintain channel 930 at about zero volts, thereby preventing the voltage $V_{WLUS1}$ of about nine volts applied to unselected word lines 735 and the voltage $V_{WLS}$ of about 24 volts applied to selected word line 725 from increasing (e.g., boosting) the voltage of channel 930. As such, the difference between the program voltage applied to selected word line 725 and the voltage on channel 930, and thus the voltage difference across the floating gate of memory cell 920, is sufficient to produce a change in the Vt level of memory cell 920. Note that the voltage on channel 930 corresponds to the voltage $V_0$ shown in FIGS. 5A, 5B, and 6.

Note that the drain select line 702, and thus the control gates of drain select gates 710 and 810, being at about 1.5 volts, and bit lines 722 and 822, and thus the drains of drain select gates 710 and 810, being at 2.5 volts prevents current flow from channels 730 and 830 through drain select gates 710 and 810 to bit lines 722 and 822 when the voltage $V_{WLUS1}$ of about nine volts is applied to unselected word lines 735 and voltage $V_{WLS}$ of about 24 volts is applied to selected word line 725. This enables the voltage on channel 730 to be increased to about 7.0 volts and the voltage on channel 830 to be increased to about 2.5 volts at time $t_5$, as shown in FIG. 7E.

The voltage difference between the program voltage applied to selected word line 725 and the voltage on channel 730, and thus the voltage difference across the floating gate of memory cell 720, is such to fully inhibit memory cell 720 from programming, and thus memory cell 720 is "fully inhibited." That is, the voltage on channel 730 acts to fully inhibit memory cell 720 while the program voltage is being applied to memory cell 720. Note that the voltage on channel 730 corresponds to the voltage $V_1$ shown in FIGS. 5A, 5B, and 6.

The voltage difference between the program voltage applied to selected word line 725 and the voltage on channel 830, and thus the voltage difference across the floating gate of memory cell 820, partially inhibits memory cell 820 from programming, and thus memory cell 820 is "partially inhibited." That is, the voltage on channel 830 partially inhibits memory cell 820 while the program voltage is being applied to memory cell 820. Note that the voltage on channel 830 corresponds to the voltage $V_2$ shown in FIG. 6.

Note that the difference between the program voltage and the voltage on channel 830 ("partially inhibited" state) is between the difference between the program voltage and the voltage on channel 730 ("fully inhibited" state) and the difference between the program voltage and the voltage on channel 930. As such, the Vt level of "partially inhibited" memory cell 820 is more likely to change than the Vt level of "fully inhibited" memory cell 720 and less likely to change than the Vt level of memory cell 920 that is being programmed.

After time $t_6$, the voltage $V_{WLUS1}$ applied to unselected word lines 735 and the voltage $V_{WLS}$ applied to selected word line 725 are brought to about zero volts. Subsequently, a program verify is performed as part of the programming cycle, for one embodiment, to determine whether the Vt level of memory cell 920 is at or above certain level, e.g., corresponding to a programmed state. When the Vt level of memory cell 920 is below the certain level, another programming cycle is performed with all of the untargeted memory cells coupled to selected word line 725, e.g., memory cells 720 and 820, being "fully inhibited" while the program voltage is applied to selected word line 725. That is, for one embodiment, memory cell 820 is partially inhibited while the program voltage is applied to memory cell 920 for only one programming cycle.

Note that the difference between the voltages respectively on channels 730, 830, and 930 and the pass voltage applied to unselected word lines 735 while the program voltage is applied to selected word line 725 is insufficient to change the Vt of the memory cells coupled to unselected word lines 735, and thus these memory cells are fully inhibited.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments. It is manifestly intended that the embodiments be limited only by the following claims and equivalents thereof.

What is claimed is:

1. A memory array, comprising:
a first column of memory cells coupled to a first data line;
a second column of memory cells coupled to a second data line;
a third column of memory cells coupled to a third data line;
wherein the second column of memory cells is between the first and third columns of memory cells; and
wherein the third data line is between the first and second data lines.

2. The memory array of claim 1, wherein second column of memory cells is successively adjacent to the first column of memory cells and the third column of memory cells is successively adjacent to the second column of memory cells.

3. The memory array of claim 2, wherein third data line is successively adjacent to the first data line and the second data line is successively adjacent to the third data line.

4. The memory array of claim 1, wherein the first, second, and third columns of memory cells each comprise a first string of memory cells coupled in series and second string of memory cells coupled in series.

5. The memory array of claim 4, wherein the first data line is coupled to the first column of memory cells at a location between the first and second strings of memory cells of the first column of memory cells, the second data line is coupled to the second column of memory cells at a location between the first and second strings of memory cells of the second column of memory cells, and the third data line is coupled to the third column of memory cells at a location between the first and second strings of memory cells of the third column of memory cells.

6. The memory array of claim 1, wherein first data line directly overlies the first column of memory cells, the second data line directly overlies the third column of memory cells, and the third data line directly overlies the second column of memory cells.

7. The memory array of claim 6, further comprising:
a first conductive strap coupled to the second column of memory cells and the second data line and extending from a location directly under the second data line to a location directly over the second column of memory cells; and
a second conductive strap coupled to the third column of memory cells and the third data line and extending from a location directly under the third data line to a location directly over the third column of memory cells.

8. The memory array of claim 7, further comprising:
a fourth column of memory cells coupled to a fourth data line that directly overlies the fourth column of memory cells, with the first column of memory cells between the second and fourth columns of memory cells and the first data line between the second and fourth data lines;
a first conductive pad coupled to the first column of memory cells and the first data line and extending from a location directly under the first data line to a location directly over the fourth column of memory cells; and
a second conductive pad coupled to fourth column of memory cells and the fourth data line and extending from a location directly under the fourth data line to a location directly over the first column of memory cells;
wherein the first conductive pad is not coupled to the fourth column of memory cells or the fourth data line and the second conductive pad is not coupled to the first column of memory cells or the first data line.

9. The memory array of claim 8, wherein the first and second conductive pads and the first and second conductive straps are formed from a common conductive layer.

10. A method of programming a memory array, comprising:
applying a first voltage differential across a first memory cell coupled to an access line;
applying a second voltage differential across a second memory cell coupled to the access line while applying the first voltage differential across the first memory cell; and
applying a third voltage differential across a third memory cell coupled to the access line while applying the first voltage differential across the first memory cell and while applying the second voltage differential across the second memory cell;
wherein the first voltage differential is less than the second voltage differential and the second voltage differential is less than the third voltage differential.

11. The method of claim 10, wherein the first voltage differential across the first memory cell is a difference between a program voltage applied to the access line and a first voltage placed on a channel of the first memory cell, wherein the program voltage applied to the access line acts to boost a second voltage previously placed on the channel of the first memory cell to the first voltage placed on the channel of the first memory cell.

12. The method of claim 11, wherein the second voltage differential across the second memory cell is a difference between the program voltage applied to the access line and a first voltage placed on a channel of the second memory cell, wherein the program voltage applied to the access line acts to boost a second voltage previously placed on the channel of the second memory cell to the first voltage placed on the channel of the second memory cell.

13. The method of claim 12, wherein the third voltage differential across the third memory cell is a difference between the program voltage applied to the access line and a voltage placed on a channel of the third memory cell, and further comprising substantially preventing the program voltage applied to the access line from boosting the voltage placed on the channel of the third memory cell.

14. A method of programming a memory array, comprising:
applying a first voltage at a first level of the first voltage to an access line coupled to a memory cell of each of first, second, and third columns of memory cells;
applying a second voltage at a first level of the second voltage to a channel of the memory cell of the first column while applying the first voltage to the access line;
applying a third voltage at a first level of the third voltage to a channel of the memory cell of the second column while applying the second voltage to the channel of the memory cell of the first column;
applying a fourth voltage to a channel of the memory cell of the third column while applying the second voltage to the channel of the memory cell of the first column and while applying the third voltage to the channel of the memory cell of the second column;
increasing the first level of the first voltage applied to the access line to a second level of the first voltage applied to the access line;
allowing the second level of the first voltage applied to the access line to, at least in part, boost the first level of the second voltage applied to the channel of the memory cell of the first column to a second level of the second voltage applied to the channel of the memory cell of the first column;
allowing the second level of the first voltage applied to the access line to, at least in part, boost the first level of the third voltage applied to the channel of the memory cell of the second column to a second level of the third voltage applied to the channel of the memory cell of the second column; and
substantially preventing the second level of the first voltage applied to the access line from changing the fourth voltage applied to the channel of the memory cell of the third column.

15. The method of claim 14, wherein a difference between the second level of the first voltage and the second level of the second voltage acts to fully inhibit programming of the memory cell of the first column, and wherein a difference between the second level of the first voltage and the second level of the third voltage acts to partially inhibit programming of the memory cell of the second column.

16. The method of claim 14, wherein allowing the second level of the first voltage to, at least in part, boost the first level of the second voltage to the second level of the second voltage, comprises substantially preventing current flow from the channel of the memory cell of the first column to a data line coupled to the memory cell of the first column while the second level of the first voltage is applied to the access line, and wherein allowing the second level of the first voltage to, at least in part, boost the first level of the third voltage to the second level of the third voltage, comprises substantially preventing current flow from the channel of the memory cell of the second column to a data line coupled to the memory cell of the second column while the second level of the first voltage is applied to the access line.

17. The method of claim 14, wherein substantially preventing the second level of the first voltage from changing the fourth voltage applied to the channel of the memory cell of the third column comprises applying the fourth voltage to a data line coupled the memory cell of the third column while the second level of the first voltage is applied to the access line.

18. The method of claim 14, wherein the first level of the second voltage is greater than the first level of the third voltage.

19. The method of claim 18, wherein the first level of the third voltage is substantially the same as the fourth voltage.

20. The method of claim 18, further comprising:
- before applying the first level of the first voltage to the access line, applying a third level of the first voltage that is less than the first level of the first voltage to the access line;
- before applying the first level of the second voltage to the channel of the memory cell of the first column, applying a third level of the second voltage that is less than the first level of the second voltage to the channel of the memory cell of the first column; and
- allowing the third level of the first voltage applied to the access line to, at least in part, boost the third level of the second voltage applied to the channel of the memory cell of the first column to the first level of the second voltage.

* * * * *

UNITED STATES PATENT AND TRADEMARK OFFICE
CERTIFICATE OF CORRECTION

PATENT NO. : 8,576,627 B2  Page 1 of 1
APPLICATION NO. : 13/178278
DATED : November 5, 2013
INVENTOR(S) : Satoru Tamada It is certified that error appears in the above-identified patent and that said Letters Patent is hereby corrected as shown below:

On the Title Page, Item (54) and in the Specification, Column 1, line 2, under "Title", delete "DATA-LINES" and insert -- DATA-LINE --, therefor.

Signed and Sealed this
Twenty-fifth Day of February, 2014

Michelle K. Lee
*Deputy Director of the United States Patent and Trademark Office*